United States Patent
Lyotard (12)

(10) Patent No.: US 6,334,780 B1
(45) Date of Patent: Jan. 1, 2002

(54) ELECTRONIC COMPONENT ADAPTER

(75) Inventor: Patrick Lyotard, Eclepens (CH)

(73) Assignee: Ultra Precision Holding SA, Monthey (CH)

( * ) Notice: Subject to any disclaimer, the term of this patent is extended or adjusted under 35 U.S.C. 154(b) by 0 days.

(21) Appl. No.: 09/424,765

(22) PCT Filed: May 28, 1998

(86) PCT No.: PCT/IB98/00829

§ 371 Date: Jan. 7, 2000

§ 102(e) Date: Jan. 7, 2000

(87) PCT Pub. No.: WO98/54937

PCT Pub. Date: Dec. 3, 1998

(30) Foreign Application Priority Data

May 30, 1997 (CH) ............................................. 1277/97

(51) Int. Cl.[7] .............................................. H01R 12/00
(52) U.S. Cl. ....................................... 439/70; 439/924.1
(58) Field of Search ............................. 439/66, 78, 79, 439/221, 710, 70, 71, 924.1, 651

(56) References Cited

U.S. PATENT DOCUMENTS

| 5,046,972 | A | | 9/1991 | Pass | |
|---|---|---|---|---|---|
| 5,232,382 | A | * | 8/1993 | Karlovich | 439/843 |
| 5,384,492 | A | * | 1/1995 | Carlson et al. | 307/147 |
| 5,887,344 | A | * | 3/1999 | Sinclair | 29/843 |
| 5,928,005 | A | * | 7/1999 | Li et al. | 439/82 |
| 5,982,635 | A | * | 11/1999 | Menzies et al. | 361/790 |
| 6,007,348 | A | * | 12/1999 | Murphy | 439/70 |
| 6,069,481 | A | * | 5/2000 | Matsumura | 324/755 |

FOREIGN PATENT DOCUMENTS

WO    WO 91/16740    10/1991

OTHER PUBLICATIONS

Advanced Interconnections/ 1996 /p.:145 / Catalog #14.*

* cited by examiner

*Primary Examiner*—Tulsidas Patel
(74) *Attorney, Agent, or Firm*—Young & Thompson

(57) ABSTRACT

Adapter connecting an electronic component removably to a printed circuit includes a female portion and a male portion whose lower surface comprises a plurality of male contact elements corresponding to female contact elements of the female element; the male contact elements and female contact elements are mounted with play in the body of the male and female portions; and the male contact elements have different lengths, permitting establishing successive levels of contact during insertion of the male portion into the female portion.

20 Claims, 2 Drawing Sheets

ELECTRONIC COMPONENT ADAPTER

BACKGROUND OF THE INVENTION

The present invention relates to an adapter or base permitting installing an electronic component removably in a printed circuit. The adapter is more particularly adapted for components using the BGA - ball grid array. BGA components have on their lower surface a grid or matrix for a soldering point in the form of a sphere or portion of a sphere. The printed circuit, in a region adapted to receive the component, comprises a matrix of contact tablets corresponding to the grid of spheres of the component. After the emplacement of the electronic component on the printed circuit, soldering is carried out, for example by passage through an oven, and the connections are thus established between the component and the printed circuit. During the phase or development or emplacement of the circuit, in the scope of operations of maintenance or in the case of failure of a component, it is necessary to be able to replace an electronic component mounted on the printed circuit. This operation must be carried out easily and without requiring new soldering. To solve this problem, there have been proposed adapters comprising two elements, a first female element whose lower surface is soldered on the printed circuit and which has on its upper surface a female connection element. The second element of the adapter comprises on its upper surface a grid of cylindrical tablets on which a component of the BGA type can be soldered. The lower surface of the male component comprises male connection means. When the upper surface of the adapter is introduced to the lower portion, the male and female connection elements coact, thereby establishing electrical contacts provided between the electronic component and the printed circuit. These adapters nevertheless have certain drawbacks which are set forth below. To compensate for errors of flatness between the printed circuit and the lower female portion of the adapter, it has been proposed to mount the female connection elements floatingly in the body of the adapter. However, this floating, combined with an error of soldering, has the tendency to push back the two elements to be soldered. Because of this, the female portion of the adapter will be in a high position and the connection with the printed circuit is not guaranteed. On the other hand, certain components such as microprocessors require numerous connections. The force applied to the component during coupling of the male portion to the female portion is proportional to the number of contacts; as a result, there is risk of damage to the component during assembly of the male and female portions of the adapter. Finally, to verify the condition of the soldering between the component and the male portion of the adapter or between the female portion and the printed circuit, it is necessary to have an x-ray device, the materials used for the adapters being opaque.

SUMMARY OF THE INVENTION

The object of the present invention is to overcome the drawbacks mentioned above by providing an adapter which guarantees good electrical connections and which permits reducing the force necessary to be applied to the component to carry out the connection during coupling of its male and female portions. The adapter according to the invention is distinguished to this effect by the characteristics defined in claim 1.

The adapter of the present invention moreover permits easily verifying the condition of the soldering without requiring the use of an x-ray device. Other advantages will become apparent from the description which follows, and the dependent claims.

BRIEF DESCRIPTION OF THE DRAWINGS

The invention will be described with reference to the accompanying drawings, which show schematically and by way of non-limiting example one embodiment of an adapter for electronic components according to the invention.

DESCRIPTION OF THE PREFERRED EMBODIMENTS

Figure 1:
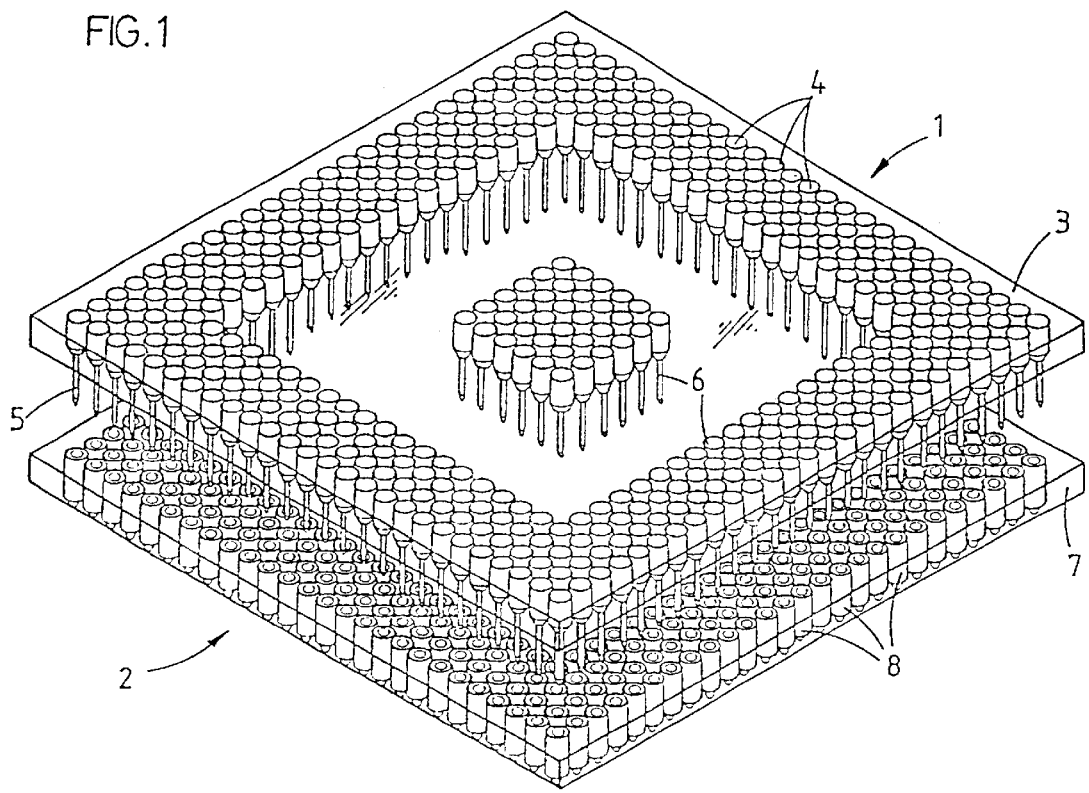
FIG. 1 is a perspective view of an adapter for electronic components according to the present invention.

With reference to FIG. 1, the adapter comprises two separate portions, a first male portion 1 adapted to receive the electronic component (not shown), and a second female portion 2 adapted to be soldered to a printed circuit (not shown). The male portion 1 is constituted by a body 3 made of an insulating plastic material. The upper surface of the male portion 1 has a matrix or grid of cylindrical tablets 4. These cylindrical tablets 4 correspond in their alignment and their configuration to the spheres or portions of spheres or solder which are found on the lower surface of an electronic component of BGA technology. It is thus possible to solder the electronic component onto the upper surface of the body 3. Male contact elements 5, 6 are implanted in the body 3. The upper end of each of these male contact elements 5 is in contact with the corresponding tablet 4. In this manner, there is established a connection between the terminals of the component and the end of the male contact elements (5, 6) which project from the lower surface of the body 3. The male contact elements 5, 6 are floating mounted in the body 3 so as to compensate possible faults of flatness of the BGA component. To do this, the diameter of the bore provided in the body 3 is slightly greater than the diameter of the contact element 5, 6. However, it is noted that a substantial float, combined with a fault of soldering, due for example to bad wetting of the sphere of the component, has the tendency to push back the two elements to be soldered. In this case, the electronic component will be in a high position and the connection between the sphere of the component and the tablet 4 is not guaranteed. This is why this characteristic is limited to very small floating. There can be cited by way of example a play comprised between 50 and 100 microns, preferably 75 microns. This very small floating permits containing the effect which pushes back the contacts during soldering. Thanks to a float of this order, the relative position of the elements to be soldered is made to be a position guaranteeing good electrical contact.

The lower female portion 2 of the adapter is also constituted by a body 7 made of a dielectric plastic material identical to that of the body 3. It comprises on its lower surface a grid or matrix of spheres or of portions of spheres 9 in contact with female contact elements 8 implanted in the body 7. The lower surface of the female portion is soldered to tablets corresponding to a printed circuit. For the same reasons as those explained above, the female contact elements 8 are mounted floatingly in the body 7. This floating play is, as for the male portion, comprised between 50 and 100 microns, preferably 75 microns.

There will preferably be selected a transparent plastic material for the production of bodies 3, 7 of the male portions 1, respectively female portions 2. This material, in addition to its dielectric characteristics, should also resist without deformation and without alteration of its transparency, temperatures higher than those encountered during the soldering operations of the components. By way of example, a material such as GRILAMID TR 70, sold by the EMS-CHEMIE AG company, is quite suitable. The use of a transparent material, and which remains transparent after the soldering operation, for the production of the body of the adapter, permits visual inspection of the produced soldering. With the aid of a simple microscope, it is easy to verify the condition of the soldering and more particular to detect the presence of short circuits. Thanks to this characteristic, the use of a costly material such as an x-ray inspection device to carry out the inspection operations, is avoided.

Figure 2:
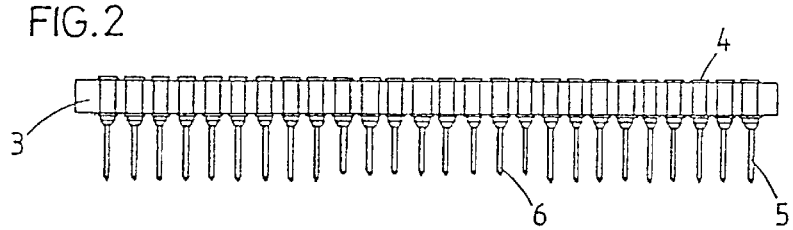
FIG. 2 is a side view of the male portion of the adapter shown in FIG. 1.

It will be seen from FIG. 2 that certain of the male contact elements 6, particularly those located in the central portion of the section of the adapter, have a shorter length than that of the male contact elements 5 located in the corners of the adapter.

Figure 3:
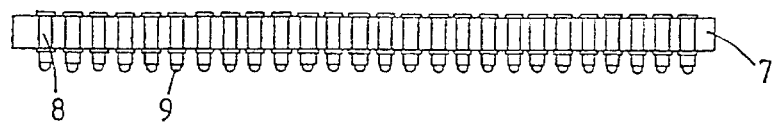
FIG. 3 is a side view of the female portion of the adapter shown in FIG. 1.

FIG. 3 shows on the other hand that the female contact elements 8 all have similar dimensions.

Figure 4:
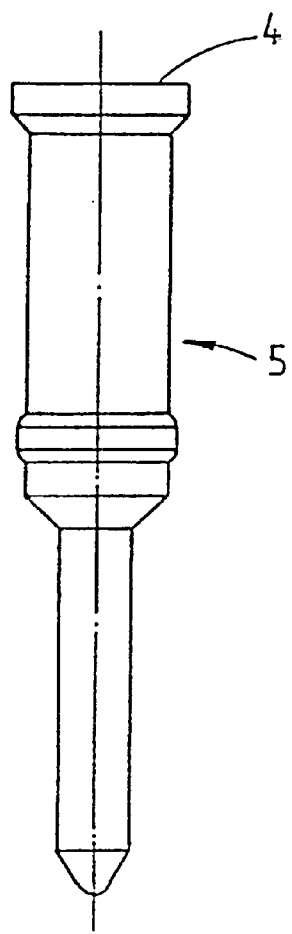
FIG. 4 is a side view of a male contact element to be implanted in the body of the male portion of the adapter.
Figure 5:
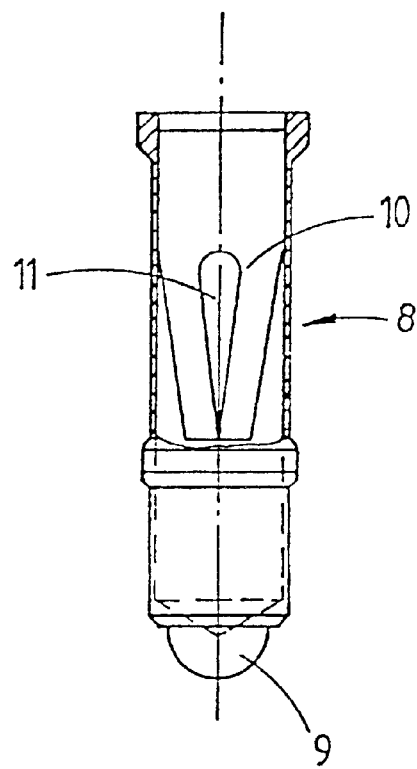
FIG. 5 is a view in partial cross-section of a female contact to be implanted in the body of the female portion of the adapter.

FIG. 4 a possible embodiment from among numerous modifications of a male contact element 5, 6. This contact element comprises an upper portion implanted in the body 3 of the adapter and a lower portion adapted to coact with the female contact element to establish the connection. The upper portion of the male contact elements constitutes the cylindrical plate 4 which emerges from the body 3 to receive the electronic component by soldering. These male contact elements are made of a conductive material such as copper or an alloy of copper and tin. They can moreover be plated with a thin layer of gold for example.

FIG. 3 shows a female contact element 8 adapted to be implanted in the body 7 of the female element 2 of the adapter. This female contact element 8 is in the form of a hollow cylindrical body closed at its lower end by a sphere of solder 9. Within this body is arranged a holding clip 10 having substantially the same diameter as the body in its upper portion, and narrowing in its lower portion. This clip permits receiving the projecting portion of the male contact element 5, 6 and holding it in service position once the coupling has been carried out. These clips 10, of conventional type, can have several longitudinal lips or slots 11 which move apart during introduction of the male contact 5, 6. They are also made of a material ensuring good conductivity and can have a surface treatment facilitating the introduction of the male element into the female element. There could be cited by way of example grease on the emergent portion outside the body of the male contact elements, as well as the interior of the female contact (8) or the clips (10) on them. This grease could be obtained by different processes such as the deposit by serigraphy or by any other known process.

Another important problem connected with this type of adapter arises from the force required to insert the male portion into the female portion. Thus, the force necessary to effect the connection is determined by the mechanical characteristics of the clip 10. Taking a typical value of 35 grams per contact, the force necessary to assemble the two portions of an adapter comprising 388 connections as shown in FIG. 1 is about 14 kilograms. These values are limit values, given the characteristics of resistance of the compressive characteristics of the components. In the case of components requiring even more connections, the risk of damaging the component during assembly increases.

The problem of extraction is less critical because the force required to extract one male contact element 5, 6 is substantially less than the force necessary to insert it. On the other hand, there is generally used a suitable extraction tool, which bears on the body of the adapter and thus protects the component during this operation.

During insertion, the principal force is produced at the moment in which the element of the male contact 5, 6 enters into contact with the clip 10 and spreads the lips of this latter. The residual force necessary, once the clip is spread, is substantially less. To decrease the force necessary for coupling the male portion to the female, the adapter according to the invention comprises male contact elements 5, 6 which have at least two different lengths. These male contact elements 5, 6 coact with the female contacts 8 during connection. It will be noted that the female contact elements 8 all have the same sizes. This permits establishing two levels of successive contact. As shown in FIGS. 1 and 2, certain male contact elements 5 have a first length to establish a first level of contact, the other male contact element 6 having a second length, which is less, to establish a second level of contact.

Thus the introduction of the male portion into the female portion takes place progressively. In a first stage, only the male contact elements 5 having the greater length, enter into contact with and space the clips 10 of the corresponding female contact elements 8. Once these latter are in place, the male contacts 6 of lesser length space in their turn the clips 10 of the female contacts 8. The forces necessary for insertion is thus distributed in two stages. So as to obtain suitable distribution of the force to be applied, a percentage comprised between 30 and 45%, preferably 37% of the male contact elements have the lesser lengths.

To promote centering of the male portion of the adapter on the female portion during insertion, there are preferably arranged the longer contact elements 5 in the corners of the body of the male portion 2 of the adapter. In a modification, the longer male contact elements 5 will be distributed over the external periphery of the contact grid.

For male contact elements having a length typically of about 3 millimeters, the difference of length between the contact elements of the first level 5 and the contact elements 6 of the second level is about 350 microns. Generally speaking, the difference in length between the male contact elements 5 permitting establishing the first level of contact and the male contact element 6 permitting establishing the second level of contact is comprised between 3 and 25%, preferably between 8 and 14%, of the length of a male contact element 5.

To carry out the function of progressive insertion of the male portion into the female portion of the adapter, it is also possible to provide that a portion of the female contact elements 8 comprise clips 10 arranged at a first distance from the introduction opening, a second portion of the female contact elements 8 comprising clips 10 arranged at a second distance, greater than the first, from the introduction opening. It follows that this function can be carried out by combining the male contact elements 5, 6 having different lengths with female contact elements 8 provided with clips 10 arranged at different distances from the opening through which the male contact element penetrates. In this way, by combining the two characteristics, there is obtained at least four levels of contact during coupling.

There could also be provided more than two levels of contact, by using male contact elements having three or four different lengths, this choice dependent on the options of construction of the adapter.

It is evident that the number of contacts as well as the distribution of these latter on the adapter can vary as a function of the BGA components to be installed and that the characteristics of the adapter according to the invention are in no way modified by different geometry of the adapter.

The description of the adapter has been given on the basis that the female element 2 is the one adapter to be soldered to the printed circuit and that the male element is designed to be joined to the BGA component. It is obvious that the reverse situation can take place; there would then be a male element soldered to the printed circuit and coacting with a female element secured to the upper surface of the electronic component without departing from the scope of the invention as claimed.

What is claimed is:

1. Adapter permitting removable connection of an electronic component to a printed circuit, comprising:
   a first portion with a lower surface having a means for permitting soldering to a printed circuit; and
   a second portion with an upper surface provided with a means for receiving, by soldering, an electronic component,
   one of said first and second portions comprising a body provided with a plurality of male contact elements and the other of said first and second portions comprising a body provided with corresponding female contact elements adapted to coact with the male contact elements and establish a connection between the electronic component and the printed circuit,
   the contact elements being configured to establish at least two levels of successive contact during coupling of the first portion to the second portion and to reduce the mechanical force necessary to couple the first portion to the second portion.

2. Adapter according to claim 1, wherein a first portion of the male contact elements has a first length, permitting establishing a first level of contact, and a second portion of the male contact elements has a second shorter length establishing a second level of contact.

3. Adapter according to claim 1, wherein,
   the female contact elements comprise clips adapted to receive the corresponding male contact elements,
   a first portion of the female contact elements comprises clips arranged at a first distance from the introduction opening, and
   a second portion of the female contact elements comprises clips arranged at a second larger distance from said introduction opening so as to provide at least two successive levels of contact.

4. Adapter according to claim 2, wherein,
   the proportion of the male contact elements having the first greater length, is comprised between 55% and 70% of the total.

5. Adapter according to claim 2, wherein,
   the proportion of the male contact elements having the first greater length, is comprised of 63% of the total.

6. Adapter according to claim 1, wherein,
   the contact elements permitting establishing the first level of contact are distributed over the outer periphery of the adapter.

7. Adapter according to claim 1, wherein,
   the contact elements permitting establishing the second level of contact are arranged in a central portion of the sides of the bodies of the adapter.

8. Adapter according to claim 1, wherein,
   the difference in length between the male contact elements permitting establishing the first level of contact and the male contact elements permitting establishing the second contact level is comprised between 3 and 25% of the length of a male contact.

9. Adapter according to claim 1, wherein,
   the difference in length between the male contact elements permitting establishing the first level of contact and the male contact elements permitting establishing the second contact level is comprised between 8 and 14% of the length of a male contact.

10. Adapter according to claim 1, wherein,
    the male contact elements and female contact elements are implanted respectively in the body of the male portion and the female portion of the adapter, in a floating manner, the play being limited to values comprised between 50 and 100 microns.

11. Adapter according to claim 1, wherein,
    the male contact elements and female contact elements are implanted respectively in the body of the male portion and the female portion of the adapter, in a floating manner, the play being limited to 75 microns.

12. Adapter according to claim 1, wherein,
    the bodies of the first and second portions of the adapter are made of a transparent insulating material.

13. Adapter permitting connecting an electronic component removably to a printed circuit, comprising:
    a first portion with a lower surface having a means for permitting soldering to a printed circuit; and
    a second portion with an upper surface provided with a means for receiving, by soldering, an electronic component,
    one of said first and second portions comprising a body provided with a plurality of male contact elements and the other of said first and second portions comprising a body provided with corresponding female contact elements adapted to coact with the male contact elements and establish a connection between the electronic component and the printed circuit,
    the contact elements being configured to establish at least two levels of successive contact during coupling of the first portion to the second portion,
    the male contact elements and female contact elements lubricated to promote the coupling of the male and female portions of the adapter.

14. Adapter according to claim 13, wherein,
    a first portion of the male contact elements has a first length, permitting establishing a first level of contact, and
    a second portion of the male contact elements has a second shorter length establishing a second level of contact.

15. Adapter according to claim 13, wherein,
    a first portion of the female contact elements comprises clips arranged at a first distance from the introduction opening, and
    a second portion of the female contact elements comprises clips arranged at a second larger distance from said introduction opening so as to provide at least two successive levels of contact.

16. Adapter according to claim 14, wherein,
    the proportion of the male contact elements having the first greater length, is comprised between 55% and 70% of the total.

17. Adapter according to claim 13, wherein, the contact elements permitting establishing the first level of contact are distributed over the outer periphery of the adapter.

18. Adapter according to claim 17, wherein, the contact elements permitting establishing the second level of contact are arranged in a central portion of the sides of the bodies of the adapter.

19. Adapter according to claim 13, wherein, the difference in length between the male contact elements permitting establishing the first level of contact and the male contact elements permitting establishing the second contact level is comprised between 3 and 25% of the length of a male contact.

20. Adapter according to claim 13, wherein, the male contact elements and female contact elements are implanted respectively in the body of the male portion and the female portion of the adapter, in a floating manner.

* * * * *